(12) United States Patent
Katsuyama

(10) Patent No.: US 10,312,666 B2
(45) Date of Patent: Jun. 4, 2019

(54) SEMICONDUCTOR LASER

(71) Applicant: SUMITOMO ELECTRIC INDUSTRIES, LTD., Osaka (JP)

(72) Inventor: Tsukuru Katsuyama, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/881,941

(22) Filed: Jan. 29, 2018

(65) Prior Publication Data

US 2018/0261980 A1 Sep. 13, 2018

(30) Foreign Application Priority Data

Mar. 9, 2017 (JP) ................................. 2017-045228

(51) Int. Cl.
| | |
|---|---|
| *H01S 5/22* | (2006.01) |
| *H01S 5/32* | (2006.01) |
| *H01S 5/34* | (2006.01) |
| *H01S 5/042* | (2006.01) |
| *H01S 5/227* | (2006.01) |

(Continued)

(52) U.S. Cl.
CPC .......... *H01S 5/3401* (2013.01); *H01S 5/0424* (2013.01); *H01S 5/0425* (2013.01); *H01S 5/3402* (2013.01); *H01S 5/026* (2013.01); *H01S 5/227* (2013.01); *H01S 5/2224* (2013.01); *H01S 5/305* (2013.01); *H01S 5/3211* (2013.01); *H01S 5/3213* (2013.01)

(58) Field of Classification Search
CPC .. H01S 5/0206; H01S 5/34346; H01S 5/3408; H01S 5/3401; H01S 5/3407; H01S 5/3402; H01S 5/343; H01S 5/227

USPC .......................................... 372/38.05, 45.01
See application file for complete search history.

(56) References Cited

U.S. PATENT DOCUMENTS 5,334,854 A * 8/1994 Ono ..................... H01S 5/06206
257/13
5,739,543 A * 4/1998 Shimizu ................ B82Y 20/00
257/14

(Continued)

FOREIGN PATENT DOCUMENTS

| EP | 1708318 | 10/2006 |
|---|---|---|
| JP | 08-279647 | 10/1996 |

OTHER PUBLICATIONS

U.S. Appl. No. 15/737,139, filed Dec. 15, 2017, Katsuyama, et al.

(Continued)

*Primary Examiner* — Tuan N Nguyen
(74) *Attorney, Agent, or Firm* — Smith, Gambrell & Russell, LLP.

(57) ABSTRACT

A semiconductor laser includes a substrate having a principal surface; an active region disposed on the principal surface of a substrate, the active region including a quantum well structure, the active region having a top surface, a bottom surface facing the top surface, and side surfaces; an emitter region including a first semiconductor region of a first conductivity type on the top surface of the active region; and a collector region including a second semiconductor region of the first conductivity type on at least one side surface of the active region. The quantum well structure includes unit cells that are arranged in a direction of an axis intersecting the principal surface of the substrate.

9 Claims, 10 Drawing Sheets

(51) Int. Cl.
*H01S 5/30* (2006.01)
*H01S 5/026* (2006.01)

(56) References Cited

U.S. PATENT DOCUMENTS

| | | | |
|---|---|---|---|
| 6,201,258 B1* | 3/2001 | Seabaugh | H01L 29/155 |
| | | | 257/14 |
| 2005/0018730 A1* | 1/2005 | Taylor | B82Y 20/00 |
| | | | 372/50.1 |
| 2005/0067615 A1* | 3/2005 | Yoshii | B82Y 10/00 |
| | | | 257/15 |
| 2006/0065886 A1* | 3/2006 | Shi | B82Y 20/00 |
| | | | 257/13 |
| 2013/0177036 A1 | 7/2013 | Su et al. | |
| 2013/0182736 A1* | 7/2013 | Hashimoto | H01S 5/343 |
| | | | 372/45.012 |
| 2014/0050241 A1 | 2/2014 | Dallesasse et al. | |
| 2014/0273323 A1 | 9/2014 | Kim | |
| 2015/0214425 A1* | 7/2015 | Taylor | H01S 5/0421 |
| | | | 385/14 |
| 2015/0318666 A1* | 11/2015 | Hammar | B82Y 20/00 |
| | | | 372/45.01 |

OTHER PUBLICATIONS

U.S. Appl. No. 15/881,954, filed Jan. 29, 2018, Katsuyama, et al.
U.S. Appl. No. 15/881,977, filed Jan. 29, 2018, Katsuyama.
Office Action dated Oct. 25, 2018 in U.S. Appl. No. 15/737,139.
Office Action dated Feb. 4, 2019 in U.S. Appl. No. 15/737,139.

* cited by examiner

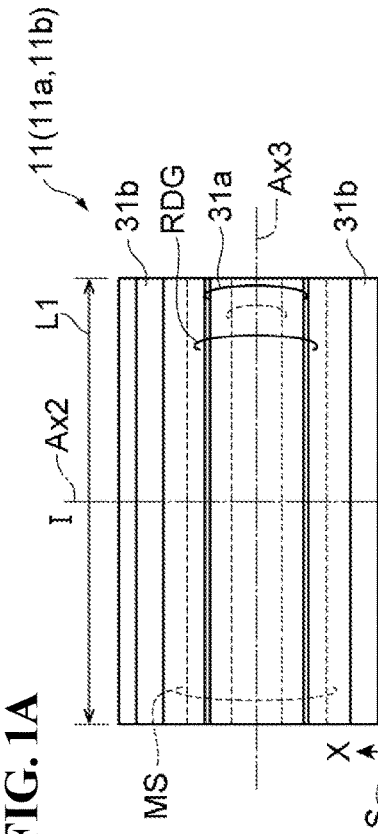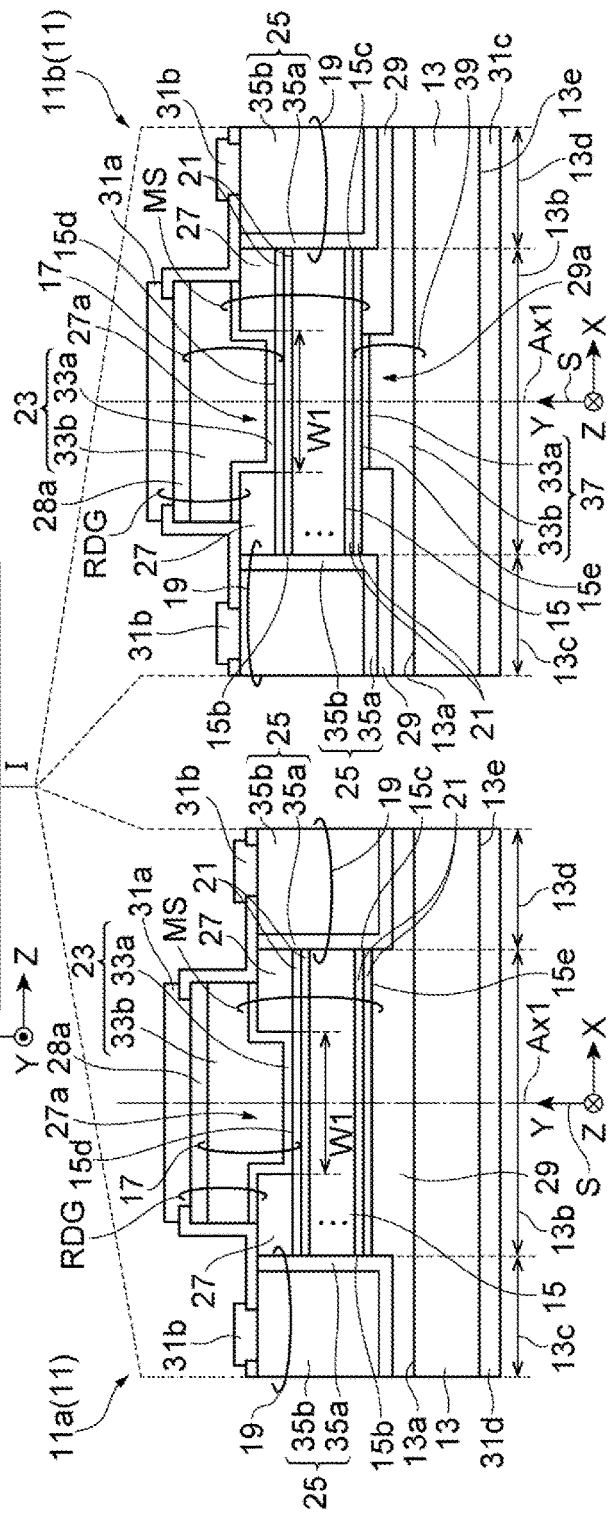
FIG. 1A
FIG. 1B
FIG. 1C

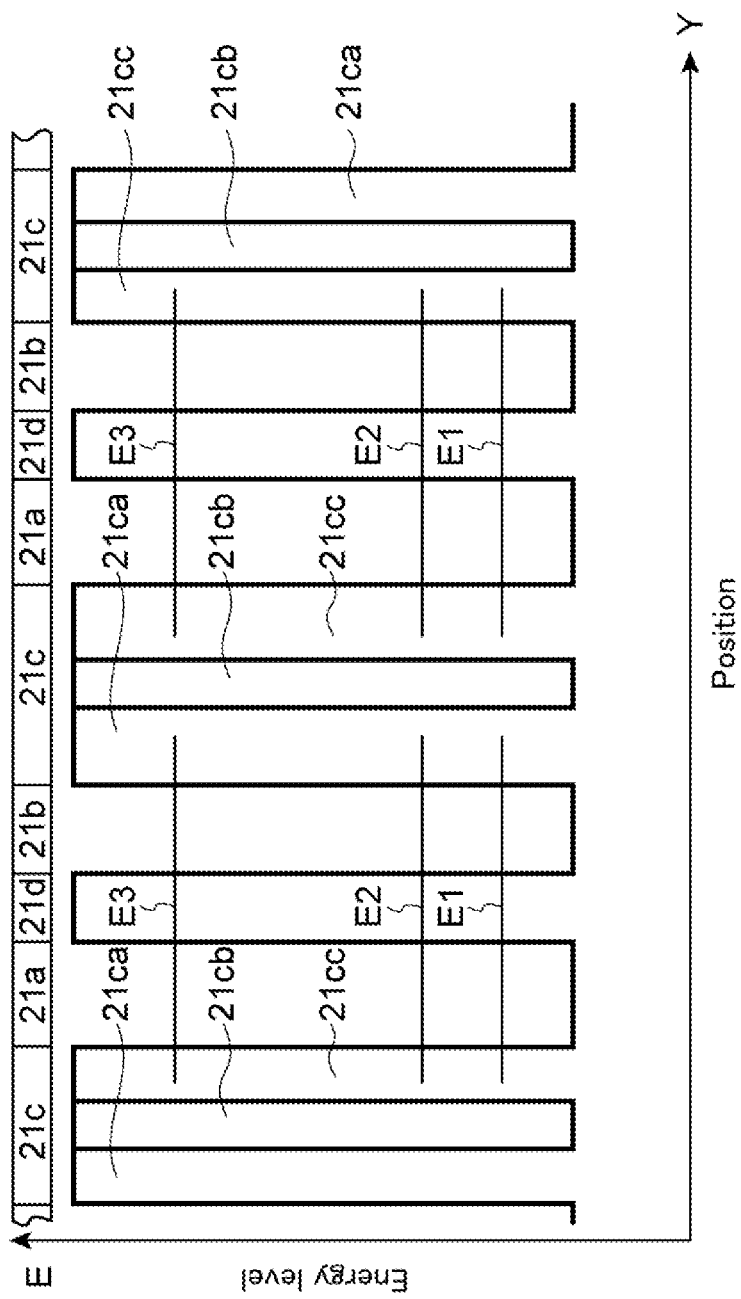

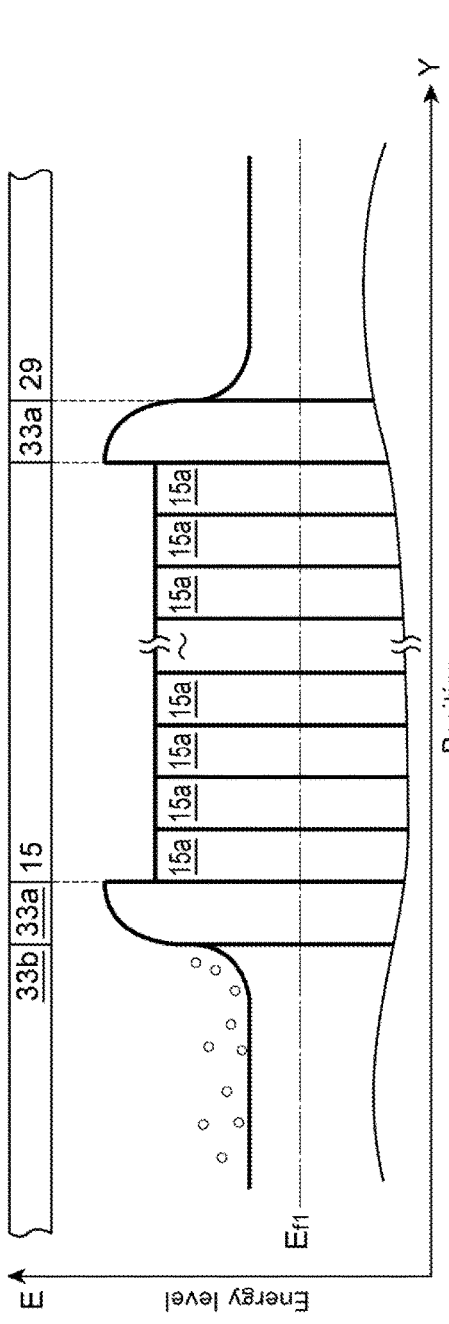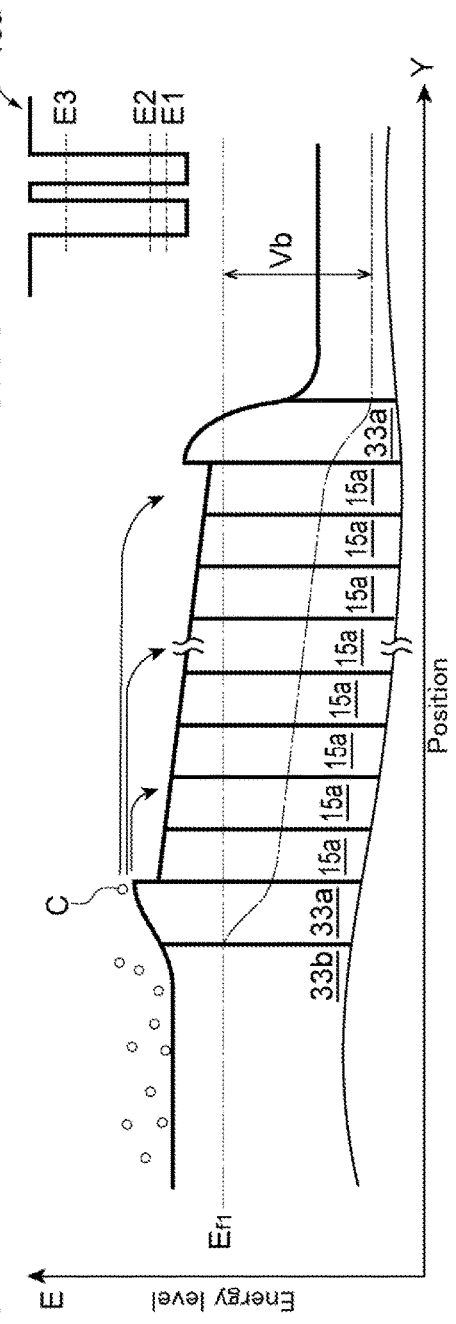

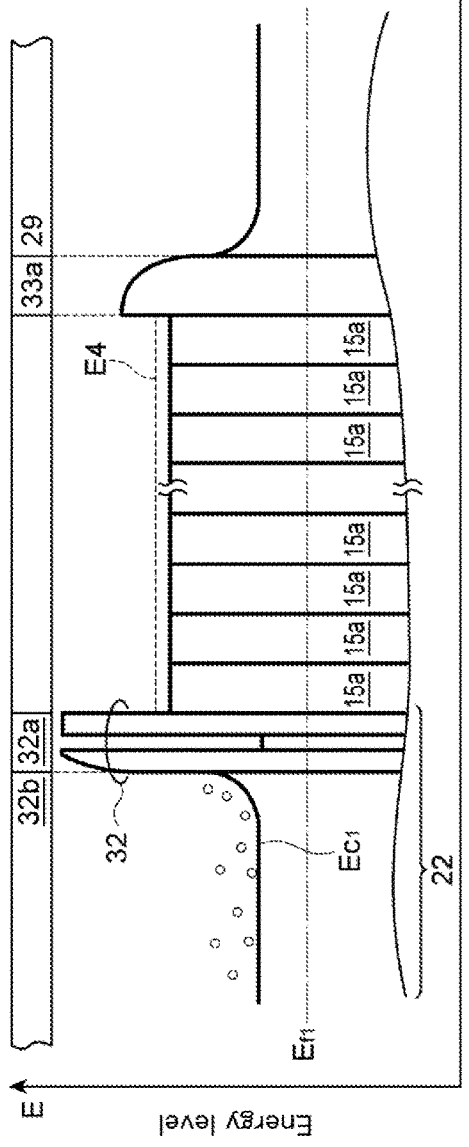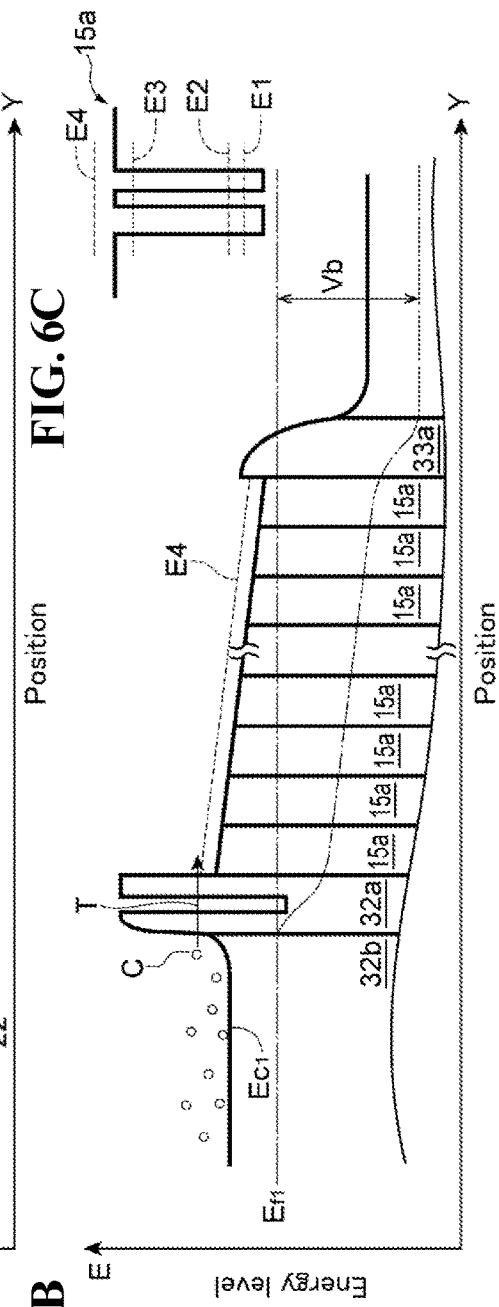

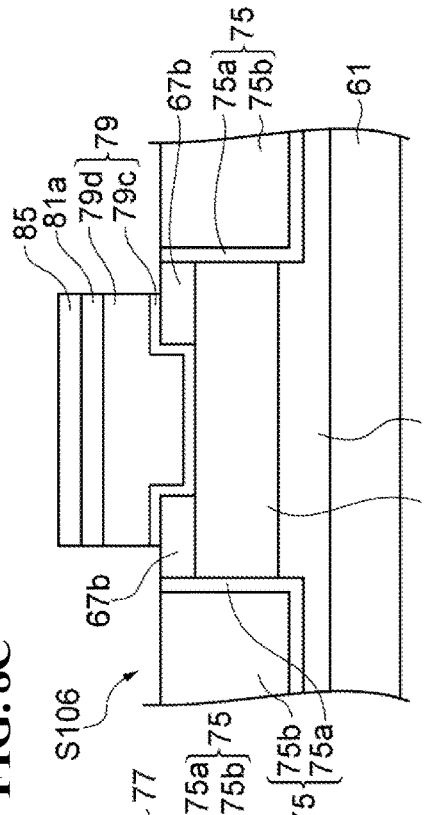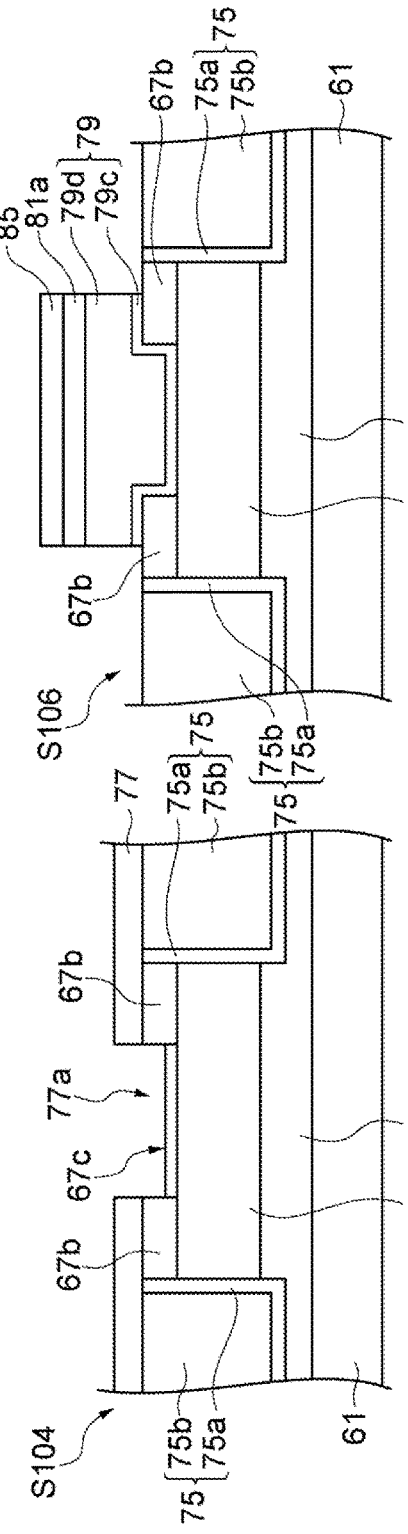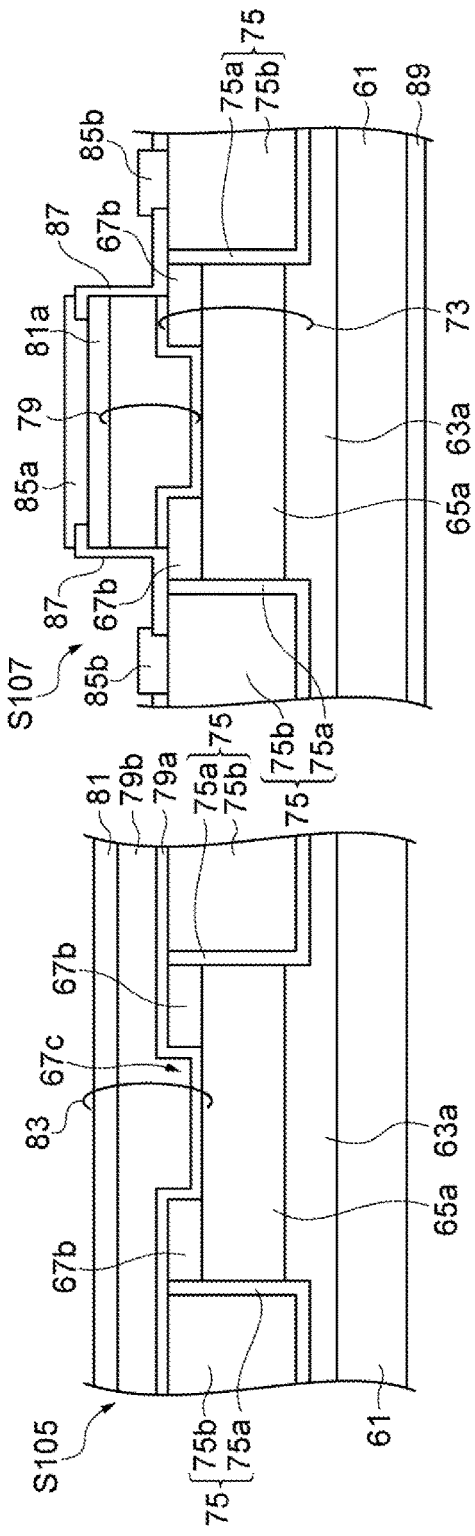

SEMICONDUCTOR LASER

BACKGROUND OF THE INVENTION

1. Field of the Invention

The present invention relates to a semiconductor laser. More particularly, the present invention relates to a semiconductor laser that has a radiation mechanism using unipolar carriers.

2. Description of the Related Art

Japanese Unexamined Patent Application Publication No. 8-279647 discloses a quantum cascade laser.

SUMMARY OF THE INVENTION

A quantum cascade laser (QCL) emits light by using intersubband transitions of unipolar carries in active layers arranged in series, which is sometimes called as the cascaded radiative transition. In order to enhance an efficiency of the cascaded radiative transition, energy levels in one active layer are necessary to be aligned with energy levels in active layers next to the one active layer. Specifically, a higher energy level in the one active layer is aligned with a lower energy level in the upstream active layer, and a lower energy level in the one active layer is aligned with a higher energy level in the downstream active layer. Such a cascaded radiative transition may enhance the optical gain in infrared wavelengths, and resultantly, the cascaded radiative transition realizes the laser oscillation in infrared regions. However, the cascaded radiative transition is inevitable to be supplied with a large bias, which resultantly prohibits a cascade structure of the active layers from operating in reduced biases.

A semiconductor laser according to one aspect of the present invention includes a substrate having a principal surface; an active region disposed on the principal surface of a substrate, the active region including a plurality of quantum well structures, the active region having a top surface, a bottom surface facing the top surface, and a side surface; a first semiconductor region of a first conductivity type on one of the top and bottom surfaces of the active region; and a second semiconductor region of the first conductivity type on the side surface of the active region. The quantum well structures are arranged in a direction of a first axis intersecting the principal surface of the substrate. The top surface and the bottom surface of the active region extend in a direction of a second axis intersecting the direction of the first axis. In addition, the side surface of the active region extends along a direction parallel to the first axis.

Objects, features, and advantages of the invention will become more apparent from the following detailed description of preferred embodiments of the invention with reference to the accompanying drawings.

BRIEF DESCRIPTION OF THE DRAWINGS

FIGS. 1A, 1B, and 1C schematically show a semiconductor laser according to one embodiment.

FIG. 4 schematically shows the energy level and layer structure of quantum well structures in Example 2.

FIGS. 5A, 5B, and 5C schematically show the supply of carriers from an emitter region into the active region of the semiconductor laser according to this embodiment.

FIGS. 6A, 6B, and 6C schematically show the supply of carriers from an emitter region into the active region of the semiconductor laser according to this embodiment.

FIGS. 8A, 8B, 8C, and 8D schematically show the main steps of the method for manufacturing the semiconductor laser according to this embodiment.

DESCRIPTION OF THE PREFERRED EMBODIMENTS

Figure 2:
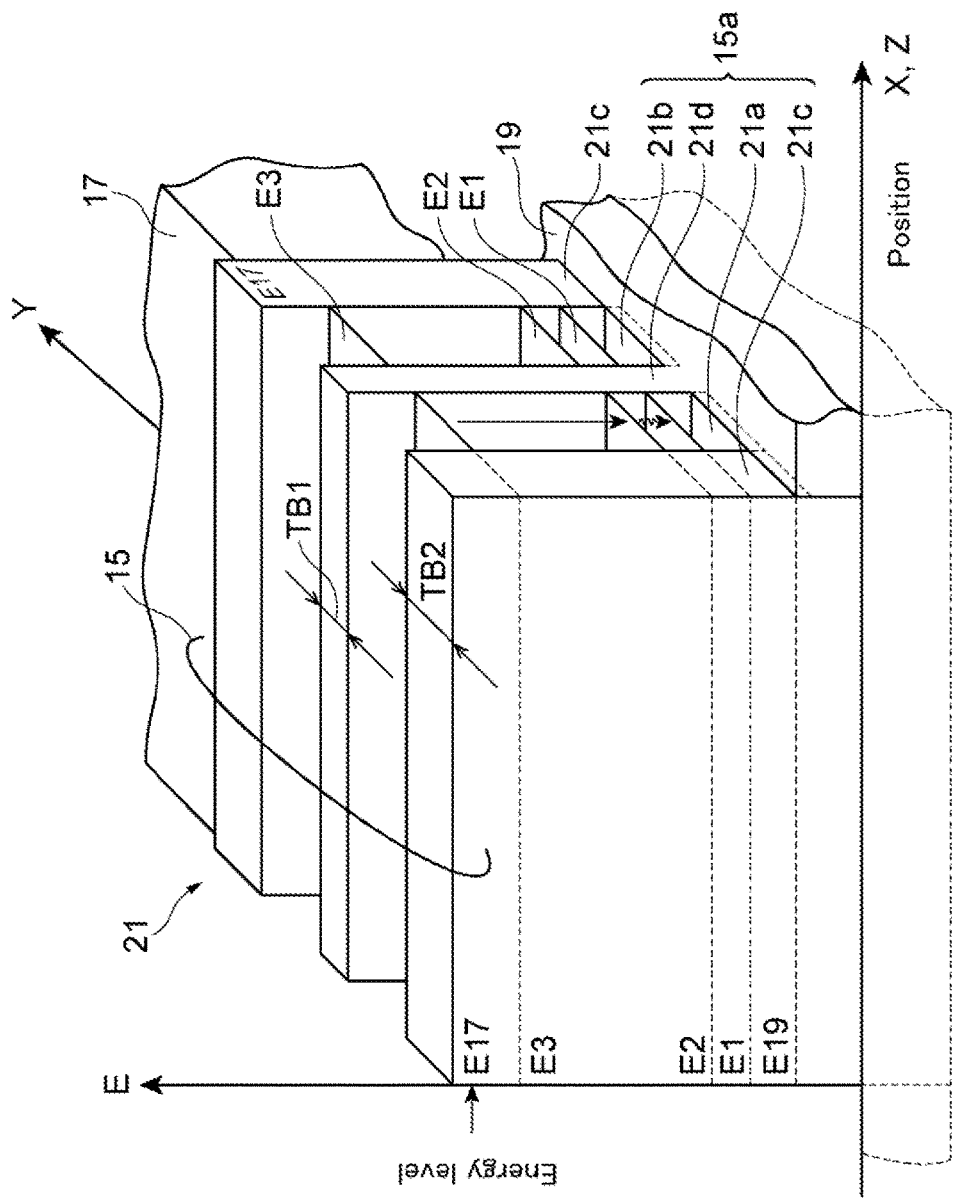
FIG. 2 shows the structure of an active region of the semiconductor laser according to this embodiment.

Continuing from the above description, some specific embodiments will now be described.

A semiconductor laser according to an embodiment includes (a) a substrate having a principal surface; (b) an active region disposed on the principal surface of a substrate, the active region including a plurality of quantum well structures, the active region having a top surface, a bottom surface facing the top surface, and a side surface; (c) a first semiconductor region of a first conductivity type on one of the top and bottom surfaces of the active region; and (d) a second semiconductor region of the first conductivity type on the side surface of the active region. The quantum well structures are arranged in a direction of a first axis intersecting the principal surface of the substrate. The top surface and the bottom surface of the active region extend in a direction of a second axis intersecting the direction of the first axis. In addition, the side surface of the active region extends along a direction parallel to the first axis.

In this semiconductor laser, both the first semiconductor region and the second semiconductor region are of the first conductivity type, and the active region generates light by utilizing intersubband transitions of unipolar carriers, i.e., electrons or holes. The first semiconductor region supplies carriers to the active region through one of the top and bottom surfaces of the active region. The second semiconductor region receives carriers from the active region through the side surface of the active region. As carriers are injected from the top or bottom surface of the active region into the active region, the carriers injected from the first semiconductor region spread over the stack of quantum well structures arranged in the direction of the first axis. The carriers in the individual quantum well structures travel through the quantum well structures while generating light through optical transitions. The carriers that have undergone transitions flow through the side surface of the active region into the second semiconductor region.

In the semiconductor laser according to an embodiment, preferably, each of the quantum well structures includes a first well layer, a second well layer, a first barrier layer, and a second barrier layer. The first barrier layer separates the first well layer from the second well layer. The first well layer separates the first barrier layer from the second barrier layer.

In this semiconductor laser, the quantum well structures readily provide an upper energy level and a lower energy level for unipolar carriers.

In the semiconductor laser according to an embodiment, preferably, the active region includes a plurality of unit cells arranged in the direction of the first axis. Each unit cell includes the first well layer, the second well layer, the first barrier layer, and the second barrier layer. In addition, the first barrier layer has a thickness smaller than that of the second barrier layer.

In this semiconductor laser, the first barrier layer has a thickness smaller than that of the second barrier layer. Therefore, the first well layer and the second well layer in each unit cell are coupled with each other more closely than with another well layer separated by the second barrier layer in the unit cell.

In the semiconductor laser according to an embodiment, preferably, each of the quantum well structures includes a barrier layer extending in a plane intersecting the direction of the first axis. The barrier layer is partially or completely doped with a dopant of the first-conductivity-type.

In this semiconductor laser, the doped barrier layer is useful for injection into the well layers.

The semiconductor laser according to an embodiment may further include a third semiconductor region of the first conductivity type on the other of the top and bottom surfaces of the active region.

In this semiconductor laser, the first semiconductor region, the second semiconductor region, and the third semiconductor region are of the first conductivity type. The active region generates light by utilizing intersubband transitions of electrons or holes. The third semiconductor region supplies carriers to the active region through the other of the top and bottom surfaces of the active region. The second semiconductor region receives carriers from the active region through the side surface of the active region. As carriers are injected from the top and bottom surfaces of the active region into the active region, the carriers injected from the first semiconductor region and the third semiconductor region spread over the stack of quantum well structures arranged in the direction of the first axis. The carriers in the individual quantum well structures travel through the wells of the quantum well structures while generating light through optical transitions. The carriers that have undergone transitions flow through the side surface of the active region into the second semiconductor region.

The semiconductor laser according to an embodiment may further include a first electrode disposed on the first semiconductor region and a second electrode disposed on the second semiconductor region. The first electrode is electrically connected to the first semiconductor region. The second electrode is electrically connected to the second semiconductor region. In addition, the semiconductor laser may further include a third electrode disposed on a back surface of the substrate.

In the semiconductor laser according to an embodiment, preferably, the quantum well structures provide an upper energy level and a lower energy level having an energy level lower than that of the upper energy level. The first semiconductor region includes a first semiconductor layer disposed on the top surface of the active region, and a second semiconductor layer disposed on the first semiconductor layer. The first semiconductor layer is in contact with the top surface of the active region. The first semiconductor layer has a conduction band energy higher than or equal to the upper energy level. The second semiconductor layer has a refractive index lower than an equivalent refractive index of the active region.

In the semiconductor laser according to an embodiment, preferably, the quantum well structures provide an upper energy level and a lower energy level having an energy level lower than that of the upper energy level. The second semiconductor region includes a third semiconductor layer disposed on the side surface of the active region, and a fourth semiconductor layer disposed on the third semiconductor layer. The third semiconductor layer is in contact with the side surface of the active region. The third semiconductor layer has a conduction band energy lower than or equal to the lower energy level. In addition, the fourth semiconductor layer has a refractive index lower than an equivalent refractive index of the active region.

In the semiconductor laser according to an embodiment, preferably, the quantum well structures further provide a relaxation energy level having an energy level lower than that of the lower energy level. The third semiconductor layer has a conduction band energy lower than or equal to the relaxation energy level.

In this semiconductor laser, the quantum well structures provide the upper energy level, the lower energy level, and the relaxation energy level. The relaxation of unipolar carriers from the lower energy level to the relaxation energy level occurs in a time shorter than the time for transition from the upper energy level to the lower energy level. The carriers that have transitioned from the upper energy level to the lower energy level relax at high speed to the relaxation energy level and are extracted from the relaxation energy level into the second semiconductor region. By providing such energy levels, the quantum well structures facilitate the creation of a population inversion of carriers, thereby increasing the laser gain due to stimulated emission.

The findings of the present invention can be readily understood from the following detailed description with reference to the accompanying drawings, which are given by way of example. A semiconductor laser according to one embodiment of the present invention will now be described with reference to the accompanying drawings, where, if possible, like reference numerals denote like elements.

FIGS. 1A, 1B, and 1C schematically show a semiconductor laser according to this embodiment. FIG. 1A is a plan view of the semiconductor laser. FIGS. 1B and 1C are sectional views taken along line I-I in FIG. 1A. For ease of understanding, a Cartesian coordinate system S is shown in FIGS. 1A, 1B, and 1C. FIG. 2 shows the structure of the active region of the semiconductor laser according to this embodiment. This semiconductor laser has, for example, a Fabry-Perot (FP) type laser structure or a distributed feedback (DFB) type laser structure.

Referring to FIGS. 1A, 1B, and 1C, a semiconductor laser 11 (11a or 11b) according to this embodiment includes a substrate 13, an active region 15, an emitter region 17, and collector regions 19. The substrate 13 has a principal surface 13a. The substrate 13, the active region 15, and the emitter region 17 are arranged in the direction of a first axis Ax1 intersecting the principal surface 13a (in this example, the Y-axis of the Cartesian coordinate system S). The principal surface 13a includes a first area 13b, a second area 13c, and a third area 13d. The first area 13b, the second area 13c, and the third area 13d extend in the direction of a second axis Ax2 intersecting the first axis Ax1 (in this example, the X-axis of the Cartesian coordinate system S). The active region 15 is disposed on the principal surface 13a of the substrate 13. The active region 15 includes a plurality of quantum well structures 21. The quantum well structures 21 are disposed on the principal surface 13a of the substrate 13. The active region 15 has a first side surface 15b, a second side surface 15c, a top surface 15d, and a bottom surface 15e facing the top surface 15d. Specifically, the active region 15 extends in the direction of a third axis Ax3 intersecting the first axis Ax1 and the second axis Ax2 (in this example, the Z-axis of the Cartesian coordinate system S) above the first area 13b. As shown in FIG. 2, the active region 15 includes unit cells 15a of the quantum well structures 21. The active region 15 includes a plurality of unit cells 15a arranged in the direction of the first axis Ax1. Specifically, each quantum well structure 21 includes a plurality of semiconductor layers (21a, 21b, 21c, and 21d) including well layers and barrier layers. These semiconductor layers (21a to 21d) are arranged in the direction of the first axis Ax1 intersecting the principal surface 13a.

The emitter region 17 includes a first semiconductor region 23. The first semiconductor region 23 is disposed on at least one of the top surface 15d and bottom surface 15e of the active region 15. In this example, the first semiconductor region 23 forming the emitter region 17 is disposed on the first area 13b. The collector regions 19 include a second semiconductor region 25 of a first conductivity type. The second semiconductor region 25 is disposed on at least one of the two side surfaces 15b and 15c of the active region 15. In this example, the second semiconductor region 25 is disposed on each of the second area 13c and the third area 13d. The active region 15 and the emitter region 17 are arranged on the principal surface 13a of the substrate 13 in the direction of the first axis Ax1. Specifically, the active region 15 is disposed between the emitter region 17 and the substrate 13. The active region 15 on the first area 13b is disposed between the collector region 19 on the second area 13c and the collector region 19 on the third area 13d. Since the emitter region 17 is disposed on the top surface 15d of the active region 15 in the first area 13b, the collector regions 19 on the second area 13c and the third area 13d are separated from the emitter region 17.

The emitter region 17 is disposed on the top surface 15d of the active region 15 which is disposed on the principal surface 13a of the substrate 13. The emitter region 17 includes one or a plurality of semiconductor layers. The collector regions 19 are disposed on the first side surface 15b and the second side surface 15c of the active region 15 that are disposed on the second area 13c and the third area 13d, respectively. The collector regions 19 include one or a plurality of semiconductor layers. The semiconductor layers forming the emitter region 17 are of the same conductivity type as those forming the collector regions 19. The semiconductor laser 11 (11a or 11b) utilizes unipolar carriers (electrons or holes). The second area 13c is separated from the third area 13d. In this example, as shown in cross-section in FIGS. 1B and 1C, the first area 13b is located between the second area 13c and the third area 13d and separates the second area 13c from the third area 13d. Thus, the emitter region 17 is electrically separated from the two collector regions 19, and carriers flow from the emitter region 17 through the active region 15 into the collector regions 19.

In the semiconductor laser 11 (11a or 11b), the first semiconductor region 23 and the second semiconductor regions 25 are of the first conductivity type. The active region 15 generates light by utilizing intersubband transitions of unipolar carriers, i.e., electrons or holes. That is, the active region 15 has a configuration different from those of conventional semiconductor lasers, which generate light by utilizing radiative transitions through the recombination of electrons and holes. The first semiconductor region 23 supplies carriers to the active region 15 through one of the top surface 15d and bottom surface 15e of the active region 15. The second semiconductor regions 25 receive carriers from the active region 15 through the first side surface 15b and second side surface 15c of the active region 15. As carriers are injected from the top surface 15d and/or bottom surface 15e of the active region 15 into the active region 15, the carriers injected from the first semiconductor region 23 spread over the stack of quantum well structures 21 arranged in the direction of the first axis Ax1. The carriers in the individual quantum well structures 21 travel through the quantum well structures 21 while generating light through optical transitions. The carriers that have undergone transitions flow through the first side surface 15b and second side surface 15c of the active region 15 into the second semiconductor regions 25.

The active region 15 and the emitter region 17 extend across the principal surface 13a of the substrate 13 in the direction of the third axis Ax3. The collector regions 19 extend along the active region 15 in the direction of the third axis Ax3 above the second area 13c (and, if necessary, the third area 13d). The semiconductor forming the emitter region 17 and the semiconductor forming the collector regions 19 have a refractive index lower than the average refractive index of the active region 15. Thus, the active region 15, the emitter region 17, and the collector regions 19 form an optical waveguide structure. Specifically, the emitter region 17 is in contact with the top surface 15d of the active region 15 and supplies carriers of the first conductivity type (electrons or holes) to the active region 15. The collector regions 19 are in contact with the first side surface 15b (in this example, the first side surface 15b and the second side surface 15c) of the active region 15 and receive the carriers of the first conductivity type (electrons or holes) from the active region 15.

In this semiconductor laser 11, the active region 15 and the emitter region 17 disposed on the first area 13b are arranged in the direction of the first axis Ax1. The active region 15 disposed on the first area 13b and the collector regions 19 disposed on the second area 13c and the third area 13d are arranged in the direction of the second axis Ax2 intersecting the first axis Ax1. Unipolar carriers are supplied from the emitter region 17 over the quantum well structures 21 of the active region 15. These unipolar carriers generate light through optical transitions from upper to lower energy levels in the subbands of the quantum well structures 21 of the active region 15. The unipolar carriers at the lower energy level flow into the collector regions 19 through optical transitions in the active region 15. The unipolar carriers injected from the emitter region 17 are the same as those flowing into the collector regions 19. This semiconductor laser 11 utilizes optical transitions of unipolar carriers for light emission. Furthermore, the arrangement of the emitter region 17, the active region 15, and the collector regions 19 does not require cascaded radiative transitions of unipolar carriers for light emission. The semiconductor laser 11 can operate at a reduced voltage as compared to conventional quantum cascade semiconductor lasers that utilize optical transitions of unipolar carriers.

As shown in FIGS. 1A, 1B, and 1C, the active region 15 is disposed in a mesa structure MS extending in the direction of the third axis Ax3. The mesa structure MS includes a first cladding layer 27 disposed on the active region 15 above the first area 13b. The first cladding layer 27 has a resistivity higher than the average resistivity of the active region 15. In this example, the first cladding layer 27 is formed of an insulating or semi-insulating semiconductor. The first cladding layer 27, being formed of a high-resistivity semiconductor, may separate the collector regions 19 from the emitter region 17 on the mesa structure MS. The first cladding layer 27 has an opening 27a reaching the top surface 15d of the active region 15 in the first area 13b. The opening 27a in the first cladding layer 27 extends along the mesa structure MS in the direction of the third axis Ax3. The emitter region 17 is in contact with the top surface 15d of the active region 15 through the opening 27a.

The semiconductor laser 11 (11a or 11b) includes a second cladding layer 29 disposed on the principal surface 13a of the substrate 13. The mesa structure MS is disposed on the second cladding layer 29 in the first area 13b. The second cladding layer 29 is located between the bottom surface 15e of the active region 15 and the substrate 13. The second cladding layer 29 is formed of a semiconductor having a resistivity higher than the average resistivity of the active region 15. In this example, the second cladding layer 29 is formed of an insulating or semi-insulating semiconductor.

The first cladding layer 27 is disposed on the active region 15 above the first area 13b. The second cladding layer 29 is disposed between the active region 15 and the substrate 13. The first cladding layer 27 and the second cladding layer 29 contribute to optical confinement within the active region 15 and allow carriers to be injected from the emitter region 17, which is separated from the collector regions 19, into the active region 15.

The first cladding layer 27 and the second cladding layer 29 have a refractive index lower than the average refractive index of the active region 15. The emitter region 17 and the collector regions 19 have a refractive index (or average refractive index) lower than the average refractive index of the active region 15. The arrangement of the active region 15, the emitter region 17, the collector regions 19, the first cladding layer 27, and the second cladding layer 29 forms a waveguide structure. The light generated in the active region 15 is optically confined in the transverse direction by the collector regions 19. The light generated in the active region 15 is also optically confined in the perpendicular direction by the emitter region 17, the first cladding layer 27, and the second cladding layer 29.

The semiconductor laser 11 (11a or 11b) includes a first electrode 31a disposed on the emitter region 17 and second electrodes 31b disposed on the collector regions 19. The semiconductor laser 11b may, if necessary, include a third electrode 31c disposed on the back surface 13e of the substrate 13. The first electrode 31a and the second electrodes 31b (and the third electrode 31c or a metal film 31d) are electrically connected to the emitter region 17 and the collector regions 19 (and the back surface 13e of the substrate 13), respectively. Specifically, the first electrode 31a and the second electrodes 31b (and the third electrode 31c or a metal film 31d) are in ohmic contact with the first-conductivity-type semiconductor forming the emitter region 17 and the first-conductivity-type semiconductor forming the collector regions 19 (and the back surface 13e of the substrate 13), respectively. In this example, the emitter region 17 forms a ridge structure RDG on the active region 15 and the first cladding layer 27. The emitter region 17 has a contact layer 28a disposed thereon. The emitter region 17 is in contact with the active region 15 through the opening 27a in the first cladding layer 27. The emitter region 17 on the active region 15 may separate the first electrode 31a from the top surface of the mesa structure MS, which allows laser light to propagate therethrough. The collector regions 19 disposed on the second area 13c and the third area 13d may separate the second electrodes 31b from the side surfaces 15b and 15c of the active region 15.

Structure of Semiconductor Laser 11

Active region 15: 50-period superlattice structure composed of units of undoped AlInAs layer/undoped InGaAs layer/undoped AlInAs layer/undoped InGaAs layer Emitter region 17: stacked semiconductor layer including Si-doped InP layer/undoped AlInAs layer, Si-doped InP layer/Si-doped AlGaInAs layer/undoped AlInAs layer, or Si-doped InP layer/undoped AlGaPSb layer Collector regions 19: stacked semiconductor layer including Si-doped InP layer/Si-doped GaInAs layer, or Si-doped InP layer/Si-doped GaInAsP layer/Si-doped GaInAs layer Width of emitter region 17 (width of ridge structure RDG): 8 μm Thickness of emitter region 17: 2 μm Width of opening 27a in first cladding layer 27 (upper current-blocking layer): 5 μm Width of opening 29a in second cladding layer 29 (lower current-blocking layer): 5 μm Width of mesa structure MS: 10 μm Height of mesa structure MS: 1 μm Thickness of core layer of active region 15: 0.8 μm Thickness of first cladding layer 27 (current-blocking layer): 0.2 μm Thickness of contact layer 28a: 0.1 μm Thickness of second cladding layer 29 (current-blocking layer): 1 μm FIG. 2 schematically shows the quantum well structures and energy level of the semiconductor laser according to this embodiment. The vertical coordinate axis (vertical axis) indicates the energy level. The remaining two coordinate axes (horizontal axes) indicate the X- and Z-axes and the Y-axis for space coordinates. Although the description with reference to FIG. 2 is directed toward a configuration in which electrons serve as carriers, this description may also be read in the context of a configuration in which holes serve as carriers based on knowledge about semiconductor physics.

As shown in FIGS. 1A to 1C and 2, the active region 15 includes one or a plurality of unit cells 15a. Each unit cell 15a includes, for example, a first well layer 21a, a second well layer 21b, a first barrier layer 21c, and a second barrier layer 21d. The second barrier layer 21d separates the first well layer 21a from the second well layer 21b. The first well layer 21a separates the first barrier layer 21c from the second barrier layer 21d. Each unit cell 15a has a quantum well structure with a well depth (the band-edge energy difference between the barriers layers and the well layers) and a well width (the thickness of the well layers) suited to provide a plurality of energy levels.

By designing the structure of the units cells 15a including the first well layer 21a, the second well layer 21b, the first barrier layer 21c, and the second barrier layer 21d, the unit cells 15a of the quantum well structures 21 may provide an upper energy level E3 and a lower energy level E2 for electrons. In addition to the upper energy level E3 and the lower energy level E2, the unit cells 15a of the quantum well structures 21 may also provide a relaxation energy level E1 for electrons.

In this semiconductor laser 11, as shown in FIG. 2, the quantum well structures 21 provide the upper energy level E3 and the lower energy level E2 for unipolar carriers (e.g., electrons). The quantum well structures 21 may also provide the relaxation energy level E1. By providing the relaxation energy level E1, the relaxation of unipolar carriers from the lower energy level E2 to the relaxation energy level E1 occurs in a time shorter than the time for transition from the upper energy level E3 to the lower energy level E2.

Carriers (electrons) are injected from the emitter region 17 into the active region 15 in a direction intersecting the stacking direction of the active region 15. The injected electrons undergo a radiative transition from the upper energy level E3 to the lower energy level E2 in the active region 15. This energy difference between the upper energy level E3 and the lower energy level E2 corresponds to the laser oscillation wavelength. The electrons that have transitioned to the lower energy level E2 relax at high speed to the relaxation energy level E1. The electrons having the relaxation energy level E1 in the active region 15 are extracted into the collector regions 19. By providing such energy levels, the quantum well structures 21 facilitate the creation of a population inversion of carriers, thereby increasing the laser gain due to stimulated emission.

The energy level of carriers in the quantum well structures in the unit cells 15a will now be described. The first well layer 21a, the second well layer 21b, the first barrier layer 21c, and the second barrier layer 21d are arranged in the direction of the Y-axis. In the band structure of the unit cells 15a, the energy level in the direction of the Y-axis is quantized into discrete energy levels. On the other hand, the energy level in the direction of the X- and Z-axes is not quantized. The conduction of carriers in the in-plane direction of the X- and Z-axes is understood as a conduction mechanism that can be approximated to a two-dimensional free electron model. The semiconductor laser 11 allows carriers to flow in the in-plane direction perpendicular to the Y-axis. That is, carriers flow in a plane containing the X- and Z-axes. The direction of the Y-axis is the stacking direction of the semiconductor layers forming the quantum well structures 21. Therefore, electrical conduction associated with the quantized levels (E3 and E2) that contribute to light emission is obtained by carriers flowing in the in-plane direction perpendicular to the stacking direction of the semiconductor layers. In contrast, common quantum cascade semiconductor lasers different from the semiconductor laser 11 allow carriers to flow in the direction in which the energy level is quantized, i.e., in the stacking direction of the semiconductor layers forming the quantum well structures 21.

The unit cells 15a are arranged in cascade in the direction of the first axis Ax1 to form the active region 15. The emitter region 17 supplies carriers parallel to the individual unit cells 15a in a direction intersecting the direction of the first axis Ax1. The individual unit cells 15a emit light in parallel as carriers are supplied to the upper energy level (E3) and transition to the lower energy level (E2). The carriers at the lower energy level (E2) relax rapidly and transition to the energy level (E1). The carriers at the energy level (E1) flow into the collector regions 19.

In each unit cell 15a, the thickness TB1 of the second barrier layer 21d is smaller than the thickness TB2 of the first barrier layer 21c. Thus, the first well layer 21a and the second well layer 21b in each unit cell 15a are separated from the well layers in a neighboring unit cell 15a by the first barrier layer 21c. In addition, the first well layer 21a and the second well layer 21b are coupled with each other more closely than with the well layers in the neighboring unit cell 15a. Quantum energy levels are created in each unit cell 15a.

In this embodiment, the emitter region has a stacked layer structure in which InP layers and AlInAs layers are alternately stacked. If necessary, a semiconductor having a band gap between those of InP and AlInAs may be disposed between the InP and AlInAs layers in the emitter region. For example, the emitter region may have an InP/AlGaInAs/AlInAs multilayer structure. Similarly, the collector region has a stacked layer structure in which InP layers and GaInAs layers are alternately stacked. If necessary, a semiconductor having a band gap between those of InP and GaInAs may be disposed between the InP and GaInAs layers in the collector region. For example, the collector region may have an InP/GaInAsP/GaInAs multilayer structure. These additional semiconductor layers may lower the heterobarrier and thus allow the semiconductor laser to operate at a lower voltage.

Referring back to FIGS. 1A, 1B, and 1C, several specific structures of the semiconductor laser 11 will be described.

First Structure

A semiconductor laser 11a will now be described. The second cladding layer 29, the active region 15, and the first cladding layer 27 are disposed in sequence on the first area 13b of the principal surface 13a of the substrate 13. The first cladding layer 27 electrically separates the collector regions 19 from the emitter region 17. The first-conductivity-type semiconductor forming the collector regions 19 in the second area 13c and the third area 13d is disposed on the second cladding layer 29. Thus, the collector regions 19 are separated from the substrate 13 through the second cladding layer 29. In this example, the substrate 13 is formed of an insulating or semi-insulating semiconductor and has the principal surface 13a. If possible, the lower cladding (second cladding layer 29) may be omitted. The use of the insulating or semi-insulating substrate 13 allows the collector regions 19 to be insulated from other conductive semiconductors. Specifically, the first-conductivity-type semiconductor forming the collector regions 19 in the second area 13c and the third area 13d is in contact with the top surface of the second cladding layer 29, the side surfaces 15b and 15c of the active region 15, and the side surfaces of the first cladding layer 27. If necessary, a metal film 31d for mounting the semiconductor laser 11a on a sub-mount, for example, may be disposed on the back surface 13e of the substrate 13.

Second Structure

A semiconductor laser 11b will now be described. The semiconductor laser 11b further includes a third semiconductor region 37 of the first conductivity type. The third semiconductor region 37 may function as an emitter region. The emitter region 17 includes the third semiconductor region 37 in addition to the first semiconductor region 23. The semiconductor laser 11b according to this embodiment has the emitter region 17 disposed on at least one of the top surface 15d and bottom surface 15e of the active region 15. The substrate 13 is made of conductive semiconductor. The second cladding layer 29 has an opening 29a located above the first area 13b. The opening 29a extends along the bottom surface 15e of the active region 15 and the principal surface 13a of the substrate 13 in the direction of the third axis Ax3. The third semiconductor region 37 is in contact with the principal surface 13a of the conductive substrate 13 through the opening 29a in the second cladding layer 29. Preferably, the third semiconductor region 37 has a refractive index that allows it to function as an optical cladding layer for confining light within the active region 15, as does the second cladding layer 29. This structure allows the third semiconductor region 37 to function as an optical cladding layer. The third semiconductor region 37, the second cladding layer 29, the active region 15, and the first cladding layer 27 are arranged in sequence on the first area 13b of the principal surface 13a of the substrate 13.

In the semiconductor laser 11b, all of the first semiconductor region 23, the second semiconductor regions 25, and the third semiconductor region 37 are of the first conductivity type. The active region 15 generates light by utilizing intersubband transitions of unipolar carriers (electrons or holes). The first semiconductor region 23 and the third semiconductor region 37 supply carriers to the active region 15 through the top surface 15d and bottom surface 15e, respectively, of the active region 15. The second semiconductor regions 25 receive carriers from the active region 15 through the side surfaces 15b and 15c of the active region 15. As carriers are injected from the top surface 15d and/or bottom surface 15e of the active region 15 into the active region 15, the carriers injected from the first semiconductor region 23 and the third semiconductor region 37 spread over the stack of quantum well structures 21 arranged in the direction of the first axis Ax1. The carriers in the individual quantum well structures 21 travel in the in-plane direction of the quantum wells while generating light through optical transitions. The carriers that have undergone transitions flow through the side surfaces (15b and 15c) of the active region 15 into the second semiconductor regions 25. Although the semiconductor laser 11b includes the first semiconductor region 23 and the third semiconductor region 37, the semiconductor laser 11b may include the third semiconductor region 37 without the first semiconductor region 23.

Third Structure

If necessary, in the first and second structures, the emitter region 17 in the first area 13b may include a first semiconductor layer 33a in contact with the top surface 15d of the active region 15 and a second semiconductor layer 33b disposed on the first semiconductor layer 33a. As shown in FIG. 2, the first semiconductor layer 33a includes a semiconductor having a conduction band energy (E17) higher than (higher in the potential direction depending on the carrier polarity) or equal to the upper energy level E3. The second semiconductor layer 33b includes a semiconductor having a refractive index lower than the equivalent refractive index of the active region 15. If the first semiconductor layer 33a is provided, the conduction band energy level thereof allows carriers to be injected from the emitter region 17 to the upper energy level E3 of the active region 15 without requiring a large external bias.

The collector regions 19 in the second area 13c and the third area 13d include a third semiconductor layer 35a in contact with either side surface of the mesa structure MS and a fourth semiconductor layer 35b disposed on the third semiconductor layer 35a. As shown in FIG. 2, the third semiconductor layer 35a includes a semiconductor having a conduction band energy (E19) lower than or equal to the lower energy level E2, preferably the relaxation energy level E1. The fourth semiconductor layer 35b includes a semiconductor having a refractive index lower than the equivalent refractive index of the active region 15. If the third semiconductor layer 35a is provided, the conduction band energy level thereof allows carriers to be extracted from the energy level of the active region 15 into the collector regions 19 without requiring a large external bias. The semiconductor laser 11b includes the first electrode 31a disposed on the emitter region 17, the third electrode 31c disposed on the back surface 13e of the substrate 13, and the second electrodes 31b disposed on the collector regions 19. The first electrode 31a and the second electrodes 31b are in ohmic contact with the first-conductivity-type semiconductor of the emitter region 17 and the first-conductivity-type semiconductor of the collector regions 19, respectively. The third electrode 31c is in ohmic contact with the first-conductivity-type semiconductor of the substrate 13.

EXAMPLE 1

Figure 3:
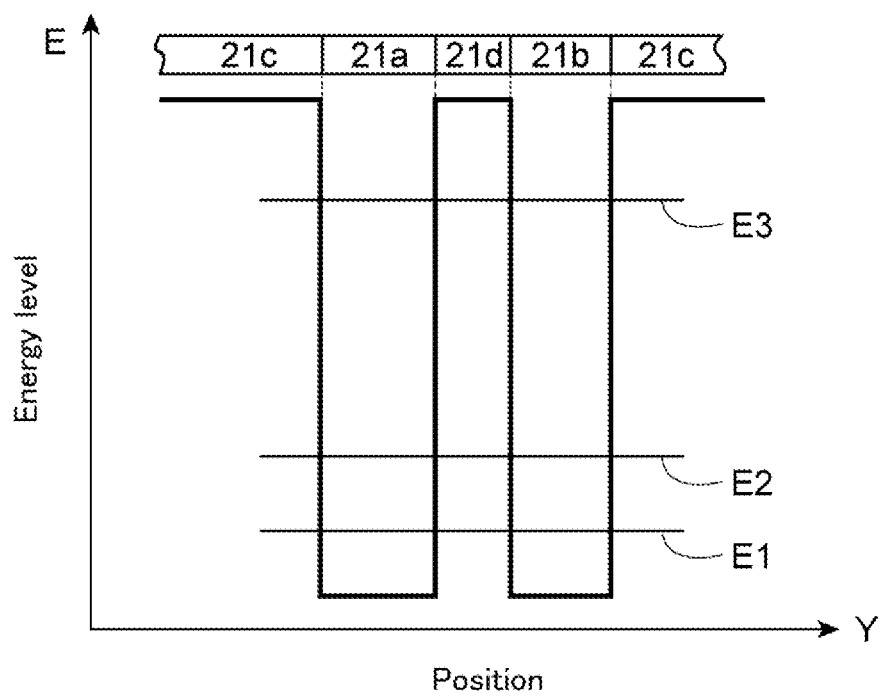
FIG. 3 schematically shows the energy level and layer structure of quantum well structures in Example 1.

The quantum well structures will now be described with reference to FIG. 3. In the following description, electrons function as carriers. Similarly, holes may function as carriers. To increase the probability of transitions from the upper energy level E3 to the lower energy level E2, it is preferred to decrease the carrier density at the lower energy level E2. The decrease of the carrier density at the lower energy level E2 is realized by quickly transiting carriers from the lower energy level E2 to a relaxation energy level E1. Each quantum well structure 21 includes, for example, a plurality of (e.g., two) well layers (21a and 21b) and one or a plurality of barrier layers provided between these well layers. The barrier layer 21d has a thickness smaller than that of the barrier layer 21c. Thus, the wave functions of electrons in the well layers (21a and 21b) extend through the barrier layer 21d into the well layers (21b and 21a) and are coupled to each other. This structure is referred to as "coupled quantum wells". The coupled quantum wells have a symmetrical well structure with respect to the centerline (the center in the thickness direction) of the barrier layer 21d. This structure provides the relaxation energy level E1 that is lower than the lower energy level E2. A difference of energy level between the lower energy level E2 and the relaxation energy level E1 corresponds approximately to the longitudinal optical (LO) phonon energy. Thus, electrons that have undergone radiative transitions from the upper energy level E3 to the lower energy level E2 may transition rapidly to the relaxation energy level E1 through phonon scattering (resonance). The coupled quantum wells also increase the overlap between the wave functions of the upper energy level E3 and the lower energy level E2 and thus increase the probability of radiative transitions, thereby increasing the laser gain.

Specific Example of Coupled Quantum Wells

Well layers/barrier layers: undoped InGaAs/undoped AlInAs

Thickness of well layer (21a): 4 nm

Thickness of inner barrier layer (21d): 2 nm

Thickness of well layer (21b): 4 nm

Thickness of outer barrier layer (21c): 10 nm

Energy difference for oscillation (energy difference between upper energy level E3 and lower energy level E2): 270 meV (oscillation wavelength: 4.6 μm)

Optical gain: 96 cm$^{-1}$/period

Epop (energy difference between lower energy level E2 and relaxation energy level E1):

35.6 meV

Substrate 13: InP substrate

The active region does not require injection layers, which are always included in conventional quantum cascade semiconductor lasers. This results in a greater flexibility in designing the quantum well structures in the quantum cascade semiconductor lasers. In addition, for example, a strain-compensated superlattice structure is used. In the strain-compensated superlattice structure, a tensile stress is introduced into the barrier layers and a compressive stress is introduced into the well layers, for example. By allowing the tensile and compressive stresses to substantially cancel each other out over the entire quantum well structures, a large conduction band gap difference (deep quantum well) can be achieved while good crystallinity is maintained. This results in improved temperature characteristics with reduced carrier leakage and a broader oscillation wavelength range.

EXAMPLE 2

As shown in FIG. 4, at least a portion of a barrier layer in each quantum well structure may be doped with a dopant of the same polarity as the carriers. This doping improves the efficiency of injection into both well layers. For example, a 10 nm thick AlInAs barrier layer may include undoped thin region 21ca and 21cc adjacent to the well layers and a doped thin region 21cb therebetween. A doping concentration of about $10^{17}$ cm$^{-3}$ or less is preferred to reduce optical loss due to free carrier absorption. This doped thin region improves the conductivity of the stacked semiconductor layer in the active region in the in-plane direction. As a result, carriers may be supplied to the well layers at positions apart from the emitter region in the in-plane direction.

EXAMPLE 3

In the semiconductor laser 11 according to this embodiment, carriers are injected from the emitter region 17 into the quantum well structures 21 in the active region 15 in the direction of the first axis Ax1 and are thereby supplied to each quantum well structure 21. The carriers in the quantum well structures 21 are transported in a direction parallel to the in-plane direction of the quantum well layers. The electron distribution in the active region is estimated by simulation. To estimate carrier transport in the in-plane direction, the device models used for numerical experimentation are shown below.
Resonator length L1: 500 μm
Opening width W of emitter region: 10 μm
One-side mesa width from center of opening in emitter region on active region in mesa structure to one upper edge of top surface of mesa: 10 μm
One-side mesa width from center of opening in emitter region on active region in mesa structure to other upper edge of top surface of mesa: 10, 20, 50, and 100 μm
Electrons drift through the opening in the emitter region in an electric field and are injected into the active region.
Active region: AlInAs/GaInAs multiple quantum well structure

| Model name | Electrical conductivity in perpendicular direction (S/m) | Electrical conductivity in transverse direction (S/m) | Ratio of electrical conductivity in perpendicular direction to electrical conductivity in transverse direction |
|---|---|---|---|
| First model | 4.3E−5 | 1.7E−2 | 2.53E−3 |
| Second model | 1.5E−5 | 1.7E−2 | 8.74E−4 |
| Third model | 1.7E−6 | 1.7E−2 | 9.84E−5 |

The notation "2.53E-3" refers to $2.53 \times 10^{-3}$.
The ratio of the electrical conductivity in the perpendicular direction to the electrical conductivity in the transverse direction is the electrical conductivity in the perpendicular direction divided by the electrical conductivity in the transverse direction.
Current Density in Transverse Direction
The calculation results of distribution of the electron current density using a model with a mesa width of 100 μm show that the electron current density in the transverse direction increases with increasing ratio of the electrical conductivity in the perpendicular direction to the electrical conductivity in the transverse direction of the quantum wells. In addition, the calculation results using a model with a mesa width of 20 μm show that the electron current density at the collector electrode does not vary in the depth direction even when the electrical conductivity ratio varies in the range from 2.53E-3 to 9.84E-5.
Current Density in Perpendicular Direction
The calculation results of distribution of the electron current density using a model with a mesa width of 100 μm show that the electron current density in the perpendicular direction is concentrated directly below the emitter electrode. In addition, the calculation results using a model with a mesa width of 20 μm show that the electron current density on the downstream side decreases with increasing ratio of the electrical conductivity in the perpendicular direction to the electrical conductivity in the transverse direction of the quantum wells. In this case, however, electrons are sufficiently distributed on the downstream side even when the electrical conductivity ratio varies in the range from 2.53E-3 to 9.84E-5.

In the semiconductor laser 11 according to this embodiment, the carriers in the quantum well structures 21 are transported in a direction parallel to the in-plane direction of the quantum well layers. At this point of view, the semiconductor laser 11 differs from conventional quantum cascade semiconductor lasers. In the semiconductor laser 11 according to this embodiment, the carriers in the quantum well structures 21 do not pass through heterobarriers that are provided in a direction perpendicular to the in-plane direction of the quantum well layers. Therefore, the semiconductor laser 11 according to this embodiment operates at low voltage. The quantum well structures 21, which are connected in parallel, provide a large laser gain without an increase in operating voltage due to the stacking of the quantum well structures 21. In addition, the semiconductor laser 11 according to this embodiment does not exhibit loss due to tunneling transport as in quantum cascade semiconductor lasers. This results in a significant reduction in power consumption as compared to conventional quantum cascade semiconductor lasers.

The structure according to this embodiment does not include injection layers that are stacked in the direction in which current flows. Conventional quantum cascade semiconductor lasers usually include the injection layers between the quantum well structures. As a result, the operating voltage is reduced for the laser device according to this embodiment. Specifically, the voltage drop between the two electrodes on the current injection (emitter) and extraction (collector) sides is the sum of the voltage drop associated with the energy of the oscillation wavelength and the voltage drop due to the series resistance of the device. To increase the optical gain, a stack of unit cells of quantum well structures is employed in the active region. However, there is no increase in voltage with increasing number of unit cells because of the operating mechanism of the structure according to this embodiment. This results in a significant reduction in the operating voltage of the laser device.

Conventional quantum cascade semiconductor lasers use cascade stacking of unit cells for light emission and carrier injection in the stacking direction. Thus, conventional quantum cascade semiconductor lasers exhibit carrier loss due to carrier injection layers. In contrast, the device structure according to this embodiment does not require carrier injection layers and thus does not exhibit carrier loss due to carrier injection layers. The device structure according to this embodiment offers a greater flexibility in designing the multilayer structure of the active region. This results in improvements in device characteristics. For example, a lower threshold current, a lower operating voltage, and lower power consumption are obtained for the device structure according to this embodiment as compared to the conventional quantum cascade semiconductor lasers. In addition, since the device according to this embodiment has a planar structure without a large step, electrodes may be provided on the top surface of a wafer. This allows function enhancements such as integration with other devices and assembly into arrays. Furthermore, the absence of carrier injection layers results in a reduction in the epitaxial layer thickness of the active region. In addition, optical characteristics may be evaluated in a nondestructive manner by techniques such as photoluminescence after epitaxial growth. This contributes to reductions in manufacturing time and cost.

The supply of carriers from the emitter region into the active region will now be described with reference to FIGS. 5A, 5B, and 5C. FIG. 5A schematically shows the band structure of the emitter region 17 and the active region 15 under no bias. FIG. 5B schematically shows the band structure of the emitter region 17 and the active region 15 under a forward external bias. In FIGS. 5A and 5B, the arrangement of the unit cells 15a is shown to indicate that the active region 15 has a superlattice structure. The superlattice structure in the arrangement of the unit cells 15a includes a periodically alternating arrangement of well layers and barrier layers. Each unit cell 15a is shown in FIG. 5C. In FIGS. 5A and 5B, "$E_{fl}$" indicates the Fermi level or quasi Fermi level, and "$E_{c1}$" indicates the conduction band. The conduction band level of the first semiconductor layer 33a is higher than the conduction band level of the second semiconductor layer 33b.

Structure of Emitter Region
First semiconductor layer 33a: undoped AlGaPSb, 20 nm thick
Second semiconductor layer 33b: Si-doped InP, 200 nm thick As shown in FIG. 5B, an external bias is applied to the semiconductor laser 11 to reduce the heterobarrier between the first semiconductor layer 33a and the second semiconductor layer 33b. As the heterobarrier is reduced, high-energy carriers C (electrons) are injected from the emitter region 17 into the superlattice structure of the active region 15 across the heterobarrier by thermal emission. The injected carriers C are attracted by an electric field and drift or diffuse through the active region 15. Simultaneously, the injected carriers C lose their energy at the levels within the conduction band that correspond to the energies of the individual carriers C, and fall into various unit cells 15a. The carriers C drift through the unit cells 15a toward the collector regions 19 while generating light through optical transitions from the higher energy level (E3) to the lower energy level (E2). The carriers C at the energy level (E2) relax rapidly to the even lower energy level (E1).

The supply of carriers from the emitter region into the active region will now be described with reference to FIGS. 6A, 6B, and 6C. FIG. 6A schematically shows the band structure of an emitter region 22 and the active region 15 under no bias. FIG. 6B schematically shows the band structure of the emitter region 22 and the active region 15 under a forward external bias. In FIGS. 6A and 6B, the arrangement of the unit cells 15a is shown to indicate that the active region 15 has a superlattice structure. The superlattice structure in the unit cells 15a includes well layers and barrier layers that are stacked alternately and periodically. Each unit cell 15a is shown in FIG. 6C. In FIG. 6C, a level E4 in the active region 15 is also shown. In FIGS. 6A and 6B, "$E_{fl}$" indicates the Fermi level or quasi Fermi level, and "$E_{c1}$" indicates the conduction band. The emitter region 22 includes a first semiconductor layer 32a including a tunneling structure 32 adjacent to the top surface of the active region 15.

Structure of Emitter Region 22
First semiconductor layer 32a: undoped AlGaPSb/GaInAs
Second semiconductor layer 32b: Si-doped InP, 200 nm thick
The tunneling structure 32 has, for example, the following structure: AlGaPSb (5 nm thick)/GaInAs (2 nm thick)/AlGaPSb (5 nm thick)

As shown in FIG. 6B, an external bias is applied to the semiconductor laser 11 to reduce the heterobarrier between the first semiconductor layer 32a and the second semiconductor layer 32b. As the conduction band level of the second semiconductor layer 32b approaches the discrete energy level (E4) in the active region 15, the carriers C are injected from the conduction band of the second semiconductor layer 32b to the energy level (E4) of the superlattice structure of the active region 15 by tunneling T through the tunneling structure 32. The injected carriers C are attracted by an electric field and drift or diffuse through the active region 15. Simultaneously, the injected carriers C lose their energy at the levels within the conduction band that correspond to the energies of the individual carriers C (e.g., the level E4), and fall into various unit cells 15a. The carriers C drift through the unit cells 15a toward the collector regions 19 while generating light through optical transitions from the higher energy level (E3) to the lower energy level (E2). The carriers C at the energy level (E2) relax rapidly to the even lower energy level (E1).

Figure 7A:
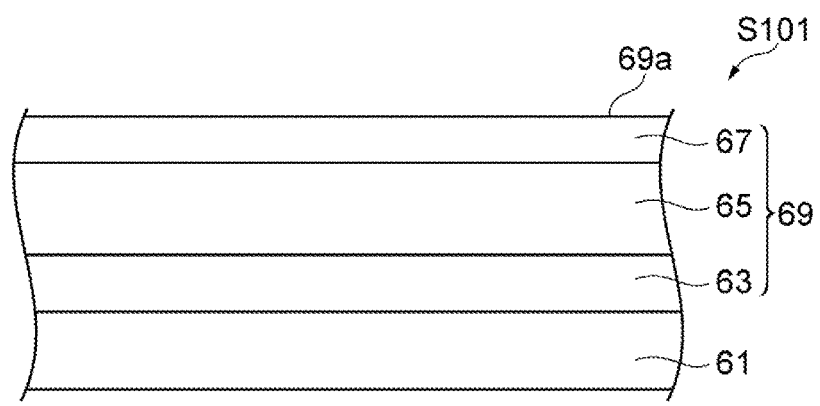
FIGS. 7A, 7B, and 7C schematically show the main steps of a method for manufacturing the semiconductor laser according to this embodiment.

A method of manufacture will now be described in outline with reference to FIGS. 7A to 7C and 8A to 8D. As shown in FIG. 7A, in step S101, an Fe-doped semi-insulating InP substrate 61 is provided. Crystal growth is performed, for example, by using a molecular beam epitaxy (MBE) method or a metal-organic vapor phase epitaxy (MOVPE) method. An InP layer 63 for forming a lower cladding layer is grown on the InP substrate 61. For example, the InP layer 63 is a Si-doped InP film. A superlattice structure 65 for forming an active region including a stack of unit cells having, for example, the four-layer structure described above is grown on the InP layer 63. An InP layer 67 for forming a current-blocking and upper cladding layer is grown on the superlattice structure 65. The InP layer 67 includes an Fe-doped InP film and/or a Zn-doped InP film. By this step, a stacked semiconductor layer 69 is formed.

Figure 7B:
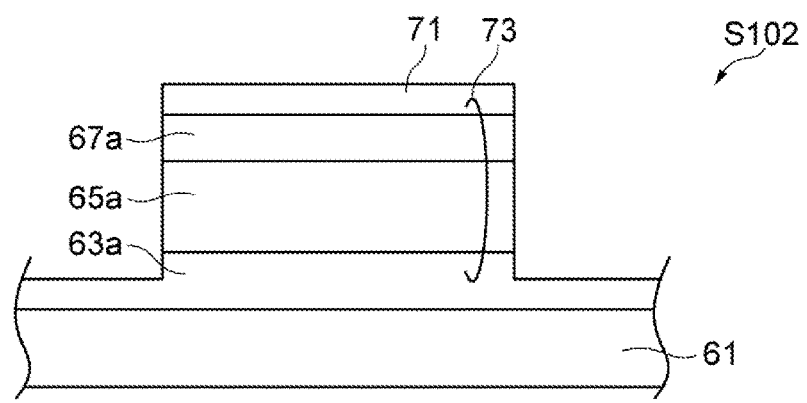

As shown in FIG. 7B, in step S102, a first SiN mask 71 for forming collector regions is formed on a principal surface 69a of the stacked semiconductor layer 69. The first SiN mask 71 includes a stripe-shaped pattern. The stacked semiconductor layer 69 is etched through the first SiN mask 71 to form a stripe structure 73. The stripe structure 73 includes a lower cladding layer 63a, an active region 65a, and an InP layer 67a.

Figure 7C:
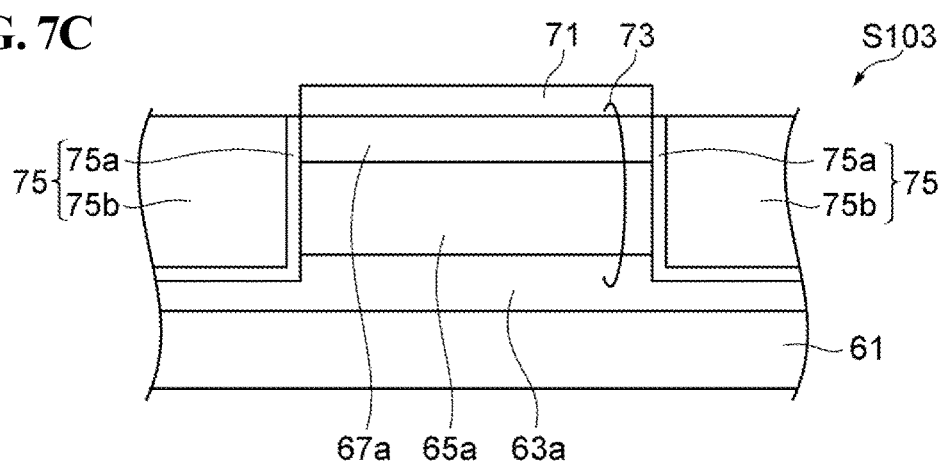

As shown in FIG. 7C, in step S103, a Si-doped InGaAs layer 75a is selectively grown for forming collector regions without removing the first SiN mask 71. A Si-doped InP layer 75b is then grown on the Si-doped InGaAs layer 75a to form collector regions 75. The stripe structure 73 is embedded by the collector region 75 so as to be planar. The Si-doped GaInAs layer 75a has a thickness of, for example, 10 to 50 nm. This is sufficient to allow optical confinement in the transverse direction and thereby stabilize the transverse mode of the semiconductor laser.

As shown in FIG. 8A, in step S104, after the first SiN mask 71 is removed, a second SiN mask 77 is formed on the principal surface of the stripe structure 73 and the principal surfaces of the collector regions 75. The second SiN mask 77 has an opening 77a for forming an emitter region. The stacked semiconductor layer in the stripe structure 73 (specifically, the InP layer 67a in the stripe structure 73) is etched through the second SiN mask 77 to form a current-blocking layer 67b having an opening 67c reaching the active region 65a. The opening 67c is separated from the side surfaces of the active region 65a.

After the second SiN mask 77 is removed, as shown in FIG. 8B, in step S105, a Si-doped AlInAs layer 79a and a Si-doped InP layer 79b for forming an emitter region are grown in sequence on the top and side surfaces of the current-blocking layer 67b, in the opening 67c, and on the top surface of the active region 65a. A Si-doped InGaAs layer 81 for forming a contact layer is then grown on the Si-doped InP layer 79b so as to form a stacked semiconductor layer 83. The Si-doped AlInAs layer 79a preferably has a thickness sufficient to block tunneling conduction of electrons, for example, more than 10 nm. The Si-doped InP layer 79b is grown in the opening 67c so as to bury the side surface of the current-blocking layer 67b. As a result, the top surface of the Si-doped InP layer 79b is substantially planar.

As shown in FIG. 8C, in step S106, a third SiN mask 85 for defining the shape of the emitter region is formed on the stacked semiconductor layer 83 disposed on the InP substrate 61. The stacked semiconductor layer 83 is etched through the third SiN mask 85 to form openings above the top surfaces of the collector regions 75 and the top surface of the current-blocking layer 67b. The top surfaces of the collector regions 75 and the top surface of the current-blocking layer 67b are exposed in the openings. The emitter region has a width narrower than that of the stripe structure 73. By etching, an emitter region 79 is formed. The emitter region 79 includes a Si-doped AlInAs layer 79c and a Si-doped InP layer 79d. A contact layer 81a is disposed on the emitter region 79. After etching, the third SiN mask 85 is removed.

After the formation of the stripe structure 73 including the active region, the collector regions 75, and the emitter region 79, as shown in FIG. 8D, in step S107, n-electrodes 85a and 85b are formed on the collector regions 75 and the emitter region 79 by the vapor deposition of electrode metal. In this example, a passivation film 87 is formed before the vapor deposition of electrode metal. The back surface of the InP substrate 61 of the thus-fabricated substrate product is polished to the desired thickness (e.g., 100 µm), followed by cleavage to form a laser bar. If necessary, a metal film 89 is formed on the back surface of the InP substrate 61.

Figure 9A:
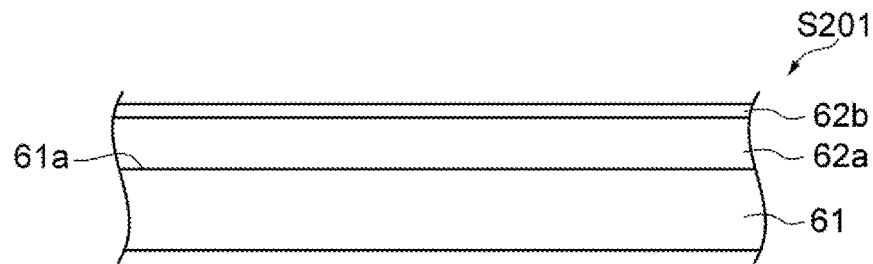
FIGS. 9A, 9B, 9C, and 9D schematically show the main steps of another method for manufacturing the semiconductor laser according to this embodiment.

Another method of manufacture will now be described in outline with reference to FIGS. 9A to 9D and 10A to 10C. As shown in FIG. 9A, in step S201, a Si-doped InP substrate 61 is provided. A stacked semiconductor layer is grown on the Si-doped InP substrate 61 by using a MBE method or a MOVPE method, for example. Specifically, a Si-doped InP layer 62a is grown on a principal surface 61a of the InP substrate 61 to form a lower cladding layer and a lower emitter region. A Si-doped AlInAs layer 62b is then grown on the Si-doped InP layer 62a. The Si-doped AlInAs layer 62b may be replaced with a semiconductor having a larger band gap than AlInAs and lattice-matched to InP, for example, AlGaPSb.

Figure 9B:
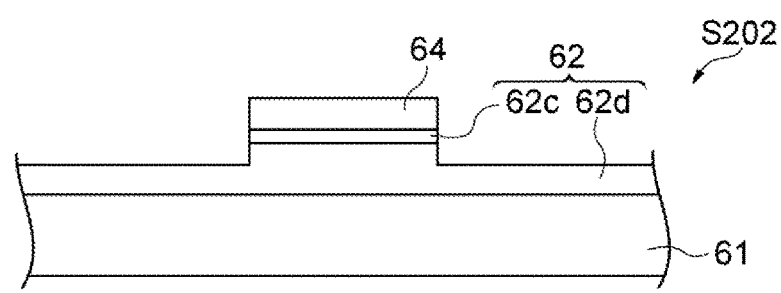

As shown in FIG. 9B, in step S202, a first SiN mask 64 is formed on the Si-doped AlInAs layer 62b. The Si-doped InP layer 62a and the Si-doped AlInAs layer 62b are etched through the first SiN mask 64 such that the entire Si-doped AlInAs layer 62b is removed while a portion of the Si-doped InP layer 62a remains. The first SiN mask 64 defines the ridge structure of the lower emitter region 62. By this etching, a lower emitter region 62 connected to the active region to be formed in the subsequent steps is formed. The lower emitter region 62 includes a Si-doped InP layer 62d and a Si-doped AlInAs layer 62c disposed on the Si-doped InP layer 62d.

Figure 9C:
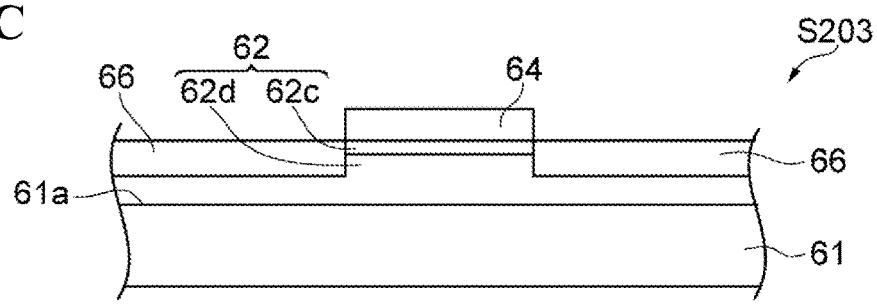

As shown in FIG. 9C, in step S203, an InP layer 66 is selectively grown on the InP substrate 61 and the lower emitter region 62 for forming a lower current-blocking layer without removing the first SiN mask 64. The InP layer 66 includes, for example, Fe-doped InP and/or Zn-doped InP.

Figure 9D:
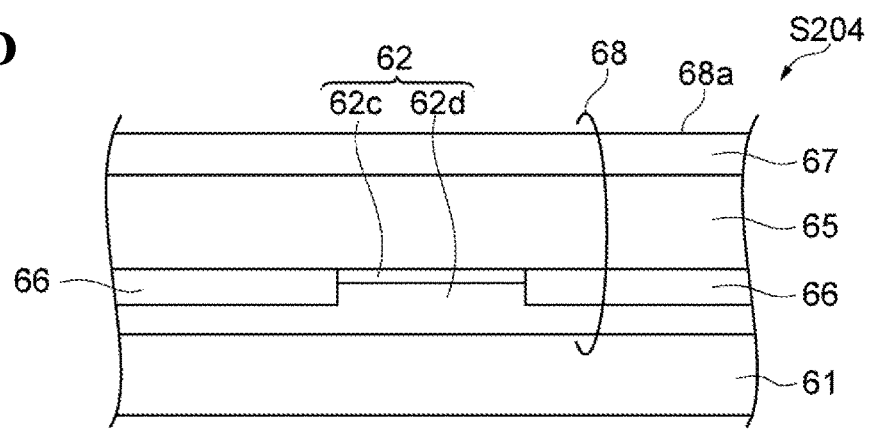

As shown in FIG. 9D, in step S204, after removing the first SiN mask 64, a superlattice structure 65 for forming an active region is grown on the lower emitter region 62 and the InP layer 66. In the embodiment, the active region includes a stack of unit cells having a four-layer structure. An InP layer 67 for forming an upper current-blocking and upper cladding layer is grown on the superlattice structure 65. The InP layer 67 includes an Fe-doped InP film and/or a Zn-doped InP film. By this step, a stacked semiconductor layer 68 is formed.

Figure 10A:
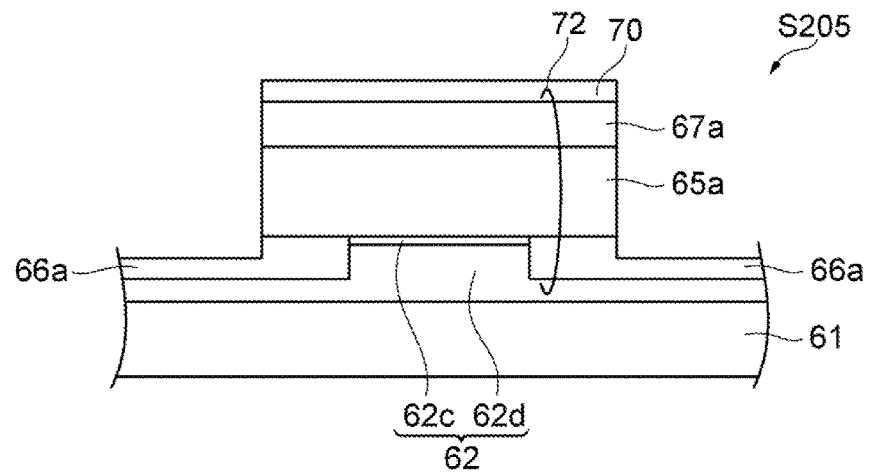
FIGS. 10A, 10B, and 10C schematically show the main steps of the other method for manufacturing the semiconductor laser according to this embodiment.

As shown in FIG. 10A, in step S205, a stripe-shaped second SiN mask 70 for forming collector regions is formed on a principal surface 68a of the stacked semiconductor layer 68. The stacked semiconductor layer 68 is etched through the second SiN mask 70 to form a stripe structure 72. The stripe structure 72 includes a portion of the lower emitter region 62. In addition, the stripe structure 72 includes an InP layer 66a, an active region 65a, and an InP layer 67a that are formed from the InP layer 66, the superlattice structure 65, and the InP layer 67, respectively.

Figure 10B:
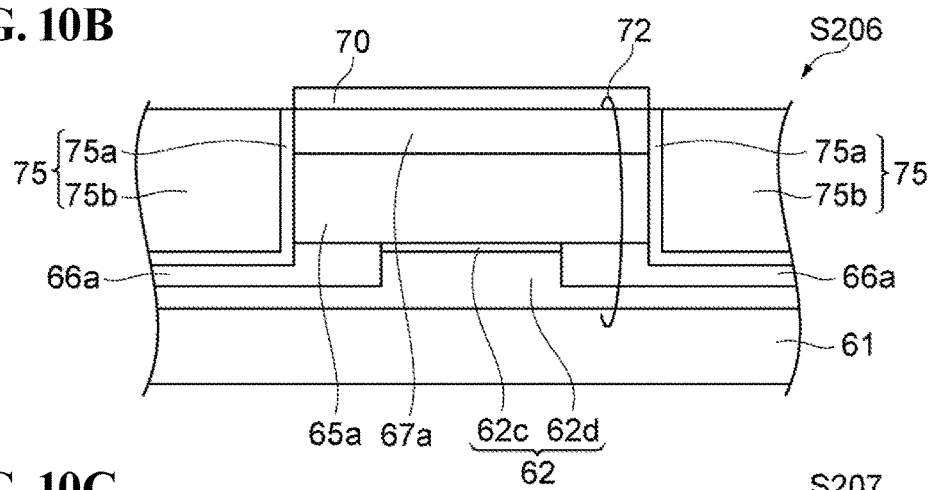

As shown in FIG. 10B, in step S206, a Si-doped InGaAs layer 75a is selectively grown on a side surface of the stripe structure 72 and on a top surface of the InP layer 66a without removing the second SiN mask 70 for forming collector regions. A Si-doped InP layer 75b is then grown on the Si-doped InGaAs layer 75a to form collector regions 75. The collector regions 75 embed the side surfaces of the stripe structure 72 so as to be planar. The Si-doped GaInAs layer 75a is relatively thin, for example, 10 to 50 nm thick. This is sufficient to allow optical confinement in the transverse direction and thereby stabilize the transverse mode of the semiconductor laser.

Figure 10C:
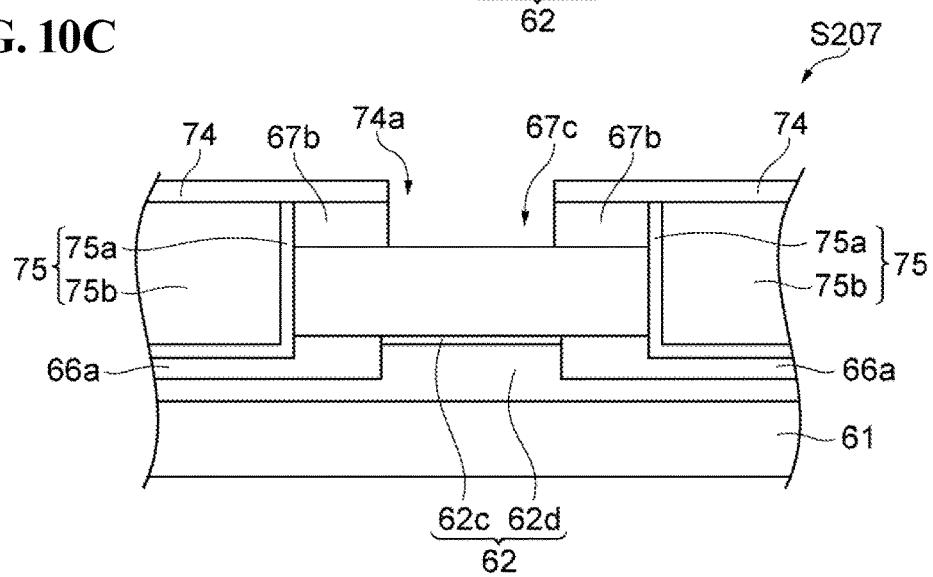

As shown in FIG. 10C, in step S207, after the second SiN mask 70 is removed, a third SiN mask 74 is formed on the principal surface of the stripe structure 72 and the principal surfaces of the collector regions 75. The third SiN mask 74 has an opening 74a for forming an emitter region. The stacked semiconductor layer in the stripe structure 72 (specifically, the InP layer 67a in the stripe structure 72) is etched through the third SiN mask 74 to form a current-blocking layer 67b (upper current-blocking layer) having an opening 67c reaching the active region 65a. The opening 67c is separated from the side surfaces of the active region 65a.

After the third SiN mask 74 is removed, as in steps S105, S106, and S107, an emitter region 79 and n-electrodes 85a and 85b are formed. In step S107, an electrode for the lower emitter region 62 ("31c" in FIG. 1C) is formed.

Although preferred embodiments have been described in order to illustrate the principles of the present invention, those skilled in the art will appreciate that various changes in configuration and details may be made without departing from such principles. The present invention is not limited to any particular configuration disclosed in the foregoing embodiments. Thus, all modifications and changes that come within the scope and spirit of the claims are to be claimed.

What is claimed is:

1. A semiconductor laser comprising:
a substrate having a principal surface;
a mesa structure disposed on the principal surface of the substrate, the mesa structure extending in a direction parallel to the principal surface, the mesa structure including an active region, the active region including a quantum well structure, the active region having a top surface, a bottom surface facing the top surface, and side surfaces;
a first cladding layer having a refractive index lower than that of the active region, the first cladding layer being in contact with the top surface of the active region, the first cladding layer having an opening;
a second cladding layer having a refractive index lower than that of the active region, the second cladding layer covering the bottom surface of the active region except for a bottom center portion thereof;
an emitter region including a first semiconductor region of a first conductivity type on the top surface of the active region, the first semiconductor region being in contact with the top surface inside the opening of the first cladding layer so as to supply carriers to the active region;
a collector region including a second semiconductor region of the first conductivity type on at least one side surface of the active region, the second semiconductor region being in contact with the at least one side surface so as to receive the carriers from the active region; and
a third semiconductor region of the first conductivity type on the bottom surface of the active region, the third semiconductor region being in contact with the bottom center portion of the bottom surface of the active region and the principal surface of the substrate, wherein
the active region emits light by the carriers transiting in the active region,
the collector region is separated from the emitter region by the first cladding layer being therebetween on the mesa structure,
the top surface and the bottom surface of the active region extend in planes parallel to the principal surface, and
the second semiconductor region is disposed on the at least one side surface of the active region and extends along a plane perpendicular to the principal surface of the substrate.

2. The semiconductor laser according to claim 1, wherein
the quantum well structure includes a plurality of unit cells each having a first well layer, a second well layer, a first barrier layer, and a second barrier layer,
the first barrier layer separates the first well layer from the second well layer, and
the first well layer separates the first barrier layer from the second barrier layer.

3. The semiconductor laser according to claim 2, wherein
the unit cells are arranged in the direction of an axis perpendicular to the principal surface, and
the first barrier layer has a thickness smaller than that of the second barrier layer.

4. The semiconductor laser according to claim 2,
wherein the first barrier layer is partially or completely doped with a dopant of the first-conductivity-type.

5. The semiconductor laser according to claim 1, further comprising a first electrode disposed on the first semiconductor region and a second electrode disposed on the second semiconductor region, wherein
the first electrode is electrically connected to the first semiconductor region, and
the second electrode is electrically connected to the second semiconductor region.

6. The semiconductor laser according to claim 5, further comprising a third electrode disposed on a back surface of the substrate.

7. The semiconductor laser according to claim 1, wherein
the quantum well structure provides an upper energy level and a lower energy level having an energy lower than that of the upper energy level,
the first semiconductor region includes a first semiconductor layer disposed on the top surface of the active region, and a second semiconductor layer disposed on the first semiconductor layer,
the first semiconductor layer is in contact with the top surface of the active region,
the first semiconductor layer has a conduction band energy higher than or equal to the upper energy level, and
the second semiconductor layer has a refractive index lower than an equivalent refractive index of the active region.

8. The semiconductor laser according to claim 1,
wherein the quantum well structure provides an upper energy level and a lower energy level having an energy lower than that of the upper energy level,
the second semiconductor region includes a first semiconductor layer disposed on the at least one side surface of the active region, and a second semiconductor layer disposed on the first semiconductor layer,
the first semiconductor layer is in contact with the at least one side surface of the active region,
the first semiconductor layer has a conduction band energy lower than or equal to the lower energy level, and
the second semiconductor layer has a refractive index lower than an equivalent refractive index of the active region.

9. The semiconductor laser according to claim 8,
wherein the quantum well structure further provides a relaxation energy level having an energy lower than that of the lower energy level, and
the first semiconductor layer has a conduction band energy lower than or equal to the relaxation energy level.

* * * * *